(12) United States Patent
Madan et al.

(10) Patent No.: US 6,427,622 B2
(45) Date of Patent: Aug. 6, 2002

(54) HOT WIRE CHEMICAL VAPOR DEPOSITION METHOD AND APPARATUS USING GRAPHITE HOT RODS

(75) Inventors: Arun Madan, Golden; Scott Morrison, Broomfield; Jianping Xi, Golden, all of CO (US)

(73) Assignee: MV Systems, Inc., Golden, CO (US)

( * ) Notice: Subject to any disclaimer, the term of this patent is extended or adjusted under 35 U.S.C. 154(b) by 0 days.

(21) Appl. No.: 09/827,129

(22) Filed: Apr. 5, 2001

Related U.S. Application Data

(62) Division of application No. 09/366,451, filed on Aug. 3, 1999, now Pat. No. 6,214,706.
(60) Provisional application No. 60/098,256, filed on Aug. 28, 1998.

(51) Int. Cl.⁷ .......................... C23C 16/00; H05H 1/00; H05H 1/02
(52) U.S. Cl. ............... 118/723 HC; 118/723 E; 118/724; 118/716; 118/723 R; 156/345.37; 156/345.43; 156/345.44; 156/345.45; 427/593; 427/592
(58) Field of Search .................. 118/724, 723 HC, 118/723 R, 716, 715, 722, 620, 723 E; 427/593, 592, 585; 219/411, 496, 391, 390; 156/345.44, 345.45, 345.37, 345.43

(56) References Cited

U.S. PATENT DOCUMENTS 3,753,792 A  * 8/1973  Tyler ........................ 148/563
4,237,150 A    12/1980 Wiesmann
5,294,778 A  * 3/1994  Carman et al. ............. 219/385
5,318,809 A  * 6/1994  Sussman ..................... 427/561
5,344,492 A  * 9/1994  Sato et al. .................. 118/725
5,648,006 A  * 7/1997  Min et al. ................. 219/444.1

OTHER PUBLICATIONS

Article "the Physics and Applications of Amorphous Semiconductors" By Arun Madan et al., Academic Press, Inc., pp. 1–18, 1988, No month.

* cited by examiner

Primary Examiner—Gregory Mills
Assistant Examiner—P. Hassanzadeh
(74) Attorney, Agent, or Firm—E. C. Hancock; F. A. Sire; Holland & Hart LLP

(57) ABSTRACT

A hot wire chemical vapor deposition method and apparatus for fabricating high quality amorphous, micro-crystalline, and poly-crystalline thin film silicon, or related materials, devices and large area modules is described. A silane gas impinges upon a hot graphite rod assembly whereas the gas is broken up into its individual constituents, these constituents then depositing on an inert substrate member. The distance between the hot graphite rod assembly and the substrate member is adjustable. A shutter is provided to shield the substrate member as the hot graphite rod assembly is heating up. The hot graphite rod assembly contains a plurality of mutually parallel and coplanar rods that are parallel to the plane of the substrate member, and the hot graphite rod assembly and/or the substrate is oscillated in a direction generally normal to the direction in which the rods extend.

25 Claims, 3 Drawing Sheets

HOT WIRE CHEMICAL VAPOR DEPOSITION METHOD AND APPARATUS USING GRAPHITE HOT RODS

CROSS-REFERENCE TO RELATED APPLICATION

This is a division of application Ser. No. 09/366,451, filed on Aug. 3, 1999, and issued as U.S. Pat. No. 6,214,706 on Apr. 10, 2001.

This non-provisional patent application claims the benefit of now abandoned provisional patent application No. 60/098,256, filed Aug. 28, 1998, and entitled THIN FILM FABRICATION APPARATUS AND METHOD.

FIELD OF THE INVENTION

This invention relates to the field of Hot Wire Chemical Vapor Deposition (HWCVD) deposition as used to produce semiconductor thin film(s) on a substrate member.

DESCRIPTION OF THE RELATED ART

Thin film semiconductors find utility in a variety of electronic devices, that are useful in applications such as active matrix liquid crystal displays, solar panels, and other related technologies.

Conventional HWCVD processes use a thin foil or a small diameter metal wire or filament, such as tungsten, tantalum, or molybdenum, as the hot element of the process. The process' hot element is heated to a high temperature, and a gas such as silane is caused to flow over, or into physical contact with, the hot element. The hot element operates to break down the gas into its constituents. These constituents then migrate to the location of a substrate member whereat a semiconductor film is formed.

Breakdown of a gas such as silane produces, as a by product, a large quantity of hydrogen. It is to be noted that hydrogen dilution may also be useful in the fabrication of certain semiconductor films.

There are several issues which are an impediment to the successful commercialization of the HWCVD technology. First, hot elements such as small diameter wire filaments are normally only about 1 mm in diameter. As a result, the manufacturing longevity of these small diameter filaments is generally limited to the deposition of about a 10–20 micron thick semiconductor film, and often less.

Also, it is believed that the surface of the prior art thin metal filaments are converted into silicides (in the presence of silane), which silicides eventually penetrate the entire depth of the filament. The presence of suicides is believed to promote wire brittleness, and this brittleness effect can be exacerbated by the hydrogen that is present during the deposition process. Therefore, the small diameter filament that is used in prior HWCVD processes usually must be replaced after a very short time period of manufacturing use.

The diameter of prior hot wires or filaments used in HWCVD processes is small, for example on the order of about 1 mm, and the filaments are physically supported at the opposite ends thereof, usually so that the filaments extend in a horizontal direction. These small diameter filaments tend to expand in a linear or horizontal direction during filament heating, and during semiconductor deposition. As a result, the hot and thin filaments tend to physically sag, thereby producing a bowed or arc-shaped filament. This bowed shape of the hot filament promotes manufacturing irreproducibility in the semiconductor film as the substrate to filament distance is thus altered.

A general tutorial on the subject of amorphous semiconductors can be found in the text THE PHYSICS AND APPLICATIONS OF AMORPHOUS SEMICONDUCTORS by Arum Madan and Melvin P. Shaw, Academic Press, Inc., 1988. As discussed therein, amorphous semiconductors can be roughly divided into hydrogenated amorphous silicon (a-Si:H) type alloys, and amorphous chalcogenides, wherein the classification of amorphous semiconductors is determined by the type of chemical bonding that is primarily responsible for the cohesive energy of the material. Also as stated therein, amorphous silicon films have been prepared using numerous deposition techniques such as: Glow Discharge (GD or Plasma Enhanced Chemical Vapor Deposition (PECVD)); CVD; reactive sputtering; and reactive evaporation, wherein glow discharge of a gas can be created by using either a DC or an RF electric field, with RF discharges being operable at lower pressures than DC discharges. This text also recognized that the opto-electric properties of a GD a-Si:H film depends upon many deposition parameters, such as the pressure of the gas, the flow rate, the substrate temperature, the power dissipation in the plasma, and the excitation frequency.

Very generally, a gas phase radical is incorporated into an amorphous silicon film by way of a surface dangling bond that is created via an H-abstraction reaction. This dangling bond diffuses to a lower energy site in a microscopic valley that is within the amorphous silicon film. The gas phase free radical then adsorbs to the surface of the amorphous silicon film, preferably at a high point on the film surface. Surface diffusion then brings the adsorbed radical into the vicinity of a dangling bond, where incorporation into the amorphous silicon film then occurs.

U.S. Pat. No. 4,237,150 to Wiesmann is of general interest for its description of the use of a vacuum chamber to produce hydrogenated amorphous silicon by thermally decomposing a gas containing silane and hydrogen, such as silane, dissilane, trisilane, tetrasilane and the like. In the Wiesmann process, the chamber is pumped down to a vacuum of about $10^{-6}$ torr. The ambient pressure before evaporation is in the low $10^{-6}$ torr range, and it rises into the low $10^{-4}$ range during deposition. A stream of silane gas is directed from a copper tube toward a tungsten or graphoil sheet or foil that is resistive heated to 1400–1600 degrees C. Upon hitting the hot foil, a portion of the silane gas ($SiH_4$) dissociates into a mixture of Si, H, SiH, $SiH_2$ and $SiH_3$. A substrate, which may be sapphire, fused quartz or silicon, is located 1–12 inches above the heated sheet/foil, and a flux of silicon and hydrogen is deposited on the substrate. The substrate can be heated, if desired, to a temperature below 500-degrees C., and preferably to 225–325-degrees C., with 325-degrees C. being optimum. At 1600-degrees C., appreciable hydrogen is generated, which hydrogen reacts with the silicon condensing on the substrate, to thereby yield an amorphous silicon hydrogen alloy. An amorphous silicon film of 2500 angstroms was obtained in about 30 minutes.

What is needed in the art of hot wire chemical vapor deposition is a method/apparatus whose improved operation results in a commercially practical production process wherein the lifetime of the hot element, and semiconductor manufacturing reproducibility, are both greatly increased.

SUMMARY OF THE INVENTION

The present invention provides a HWCVD process wherein the process' hot or heated element comprises a plurality of generally parallel, physically spaced, coplanar, and relatively large diameter rods that are formed of an electrically conductive and a non-metallic material that has a high melting temperature (in excess of 2000 degrees centigrade) and that is inert to the constituents such as silicon and germanium, examples being carbon, graphite (the crystalline allotropic form of carbon), electrically conductive silicon carbide (SiC), and high temperature and electrically conductive ceramic.

Advantages achieved by the invention operate to convert prior HWCVD processes to a production-compatible semiconductor deposition technology. Materials other than graphite or graphite-like materials can be employed in accordance with the invention; for example, high temperature electrically conducting ceramic.

In accordance with the present invention, a HWCVD process includes a heated element in the form of a plurality of physically spaced and relatively thick graphite or graphite-like rods. Advantages of the present invention include, but are not limited to:

a) Non-metallic rod material such as graphite, has a melting temperature that is much higher than metallic tungsten; therefore, a wider range of temperature can be used during the deposition process.

b) Because the resistivity of a non-metallic graphite rod is much higher than that of small diameter metal wire, graphite rod heating elements in according with this invention can be constructed in the form of a plurality of relatively thick rods, and not thin filaments as was used in the prior art. This thick rod construction results in a graphite rod heating assembly that is more stable and more durable than prior metal filament heating assemblies.

c) Graphite is chemically more inert than metal; hence, the hot graphite rods of the present invention do not react with silicon or hydrogen radicals as easily as do prior metal filaments. This further enhances the durability of graphite hot rods in accordance with the present invention for HWCVD applications.

d) Because hot graphite rods are chemically more stable, and have an extremely high melting temperature, hot graphite rods are less likely to contaminate high quality semiconductors, such as silicon based semiconductors.

The HWCVD technique of this invention is not limited to the use of silane gas, since a usable gas combination could include, $SiF_4$ and $H_2$ and/or silane or other gas combinations. These gas combinations could include, but are not limited to, dichlorosilane, germane, and methane to fabricate semiconductors such as Si:Ge, SiC, SiN, GeN. This list of gasses is meant only as a guide, and the present invention is not to be limited to these gas precursors, but could include fluorine precursors to reduce density of defect states in the resulting material. Further, with the use of dopant gasses, such as $PH_3$ and $B_2H_6$ or the like, semiconductor doping of n-type and p-type can be accomplished with silicon as the host matrix. The technique of the present invention can also be used with liquid sources to produce materials such as GaAs, GaN, SiC and the like. Other suitable n-type and p-type dopants could be used in the fabrication of semiconductor materials, such as GaAs.

As an example, to further improve the electronic quality of a poly-crystalline silicon films, such as its grain size, the film can be heat treated via a suitable temperature profile treatment. This process step could be accomplished with suitable heating and cooling techniques, such as, but not limited to, intense light illumination, passing the film through a preheated high temperature zone, etc. Heat treatment can also be simultaneously accomplished during the HWCVD process.

With an appropriate arrangement of deposition equipment and processing procedures, the present invention can be repeated, to thereby form a number of layers, such as p-type, i-type, n-type materials, to thereby form optoelectrical devices and large area modules such as solar cells, optical sensors, and thin film transistors. A major advantage of the present invention is that the deposition rate is significantly higher when compared to most CVD and Physical Vapor Deposition (PVD) methods. Further, this invention is simpler and more practical for use in production processes.

In other embodiments of the invention, semiconductor material growth is enhanced in different ways. For instance, by superimposing an external electric field, such as RF (radio frequency) or DC, on the graphite rods, or by the application of a bias electric field to the substrate or to an intervening mesh that is located between a substrate, such as glass, and the graphite rods.

As a feature of the present invention, a generally planar substrate is physically supported a short distance away from a hot element assembly having a plurality of graphite rods that are supported in a plane that is generally parallel with the plane of the substrate. The hot element assembly comprises a plurality of mutually parallel graphite or graphite-like rods, and the hot element assembly is constructed and arranged so the center-to-center distance between the graphite rods can be varied as desired. In operation, it is preferred, but not essential, that the hot-element assembly be oscillated in a direction that is generally normal to the axis of the graphite rods, and in a manner to maintain the plane of the hot element assembly at all times parallel to the plane of the substrate. It is preferred, but not essential, that the amount of this rod oscillation movement be generally equal to the center to center spacing of the graphite rods.

The new and unusual HWCVD process in accordance with the present invention finds utility in the manufacture of thin film, multi-layer, solar cells having layers in the 0.1–10 micron thickness range, gas sensor arrays, image scanners, charge coupled devices, photovoltaic modules, thin film transistors, and in the manufacture of amorphous silicon layer(s), micro-crystalline silicon layer(s), poly-crystalline silicone layer(s), superconductor films, dielectric films, and diamond-like layer(s).

The new and unusual HWCVD process in accordance the present invention also finds utility for use in a computerized cluster tool deposition assembly wherein a plurality of individually operable vacuum deposition chambers are located generally in a circle about a centrally located vacuum isolation chamber that contains a computerized robotic arm that operates to move a substrate member between the vacuum deposition chambers, as multiple layers are deposited on the substrate member in any desired sequence. The new and unusual HWCVD process in accordance the present invention also finds utility for use in an in-line system wherein a plurality of individual vacuum deposition chambers are serially arranged in a generally linear fashion.

While this invention will be described relative to the vacuum deposition on one planar surface of a one piece and generally planar substrate member, the physical configuration of the substrate member is not to be taken as a limitation on the spirit and scope of this invention. As is well known by those having normal skill in the art, the substrate can be a stainless steel foil or a plastic substrate such as polyemide.

Without limitation thereto, the present invention provides a vacuum deposition chamber having a substrate carrier that is capable of holding a generally planar or flat substrate that ranges in size from about 10×10 cm to about 30×40 cm, with the substrate member being maintained at no more than 550 degrees C. A hot rod assembly in accordance with this invention comprises a generally planar or flat grid design, with the substrate to grid distance being variable. Automated and computer controlled relative movement, or relative oscillation, occurs between the grid and the substrate member, as the substrate to grid distance remains constant at whatever distance has been selected. A selected gas is caused to impinge upon the hot rods, and gas constituents are thereby produced in the space between the grid and the substrate member. In a preferred configuration, the substrate carrier occupies a generally horizontal plane, the substrate carrier is mounted on horizontally extending tracks, vertically above the hot rod grid which also occupies a generally horizontal plane, and the substrate carrier is moved or oscillated in its generally horizontal plane.

These and other features, advantages and objects of this invention will be apparent to those of skill in the art upon reference to the following detailed description, which description makes reference to the drawing.

BRIEF DESCRIPTION OF THE DRAWINGS

FIG. 3 shows additional details of the hot rod CVD apparatus of the present invention, along with supporting components that are attached to a surrounding vacuum chamber.

DESCRIPTION OF THE PREFERRED EMBODIMENT

Figure 1:
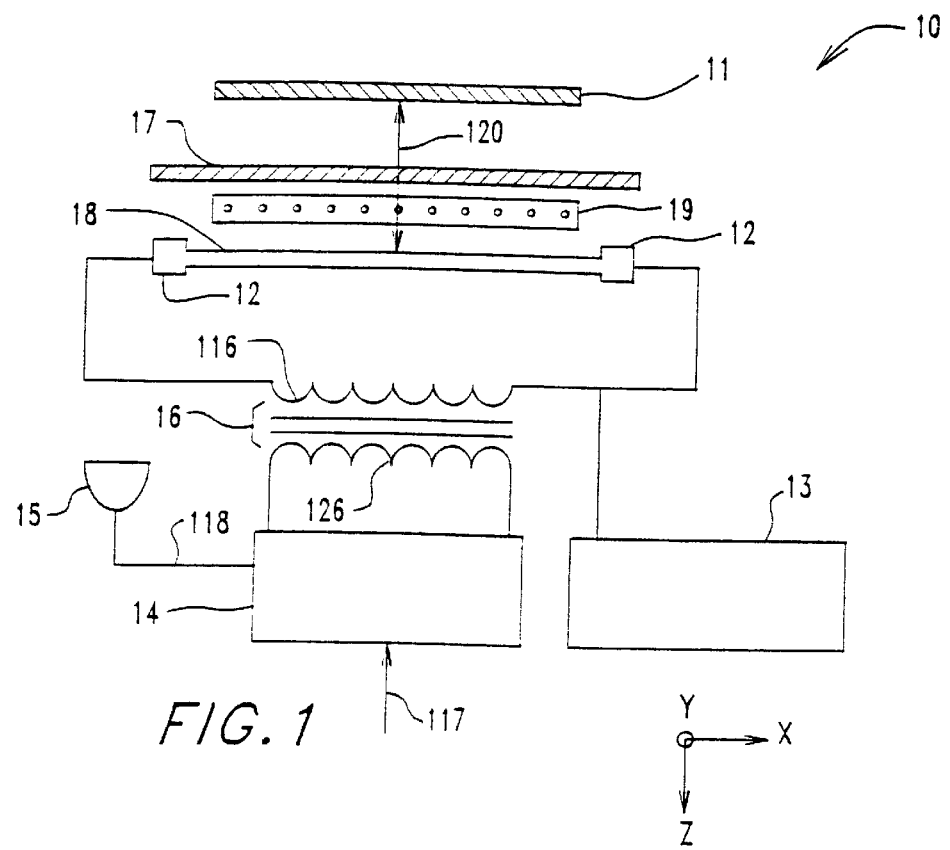
FIG. 1 is a showing of the core or interior of a carbon, graphite or graphite-like hot rod CVD apparatus in accordance with the invention.

FIG. 1 is a first showing of the invention. In this figure, only the core 10 of a carbon rod (graphite rod) CVD apparatus in accordance with the invention is shown for purposes of convenience. As will be appreciated, portions of core 10 are within, and are surrounded by, a vacuum deposition chamber such as will be described relative to FIG. 2.

A set of linear and elongated carbon (graphite) rods 18 have their opposite ends supported by, and electrically connected through, two linear and parallel carbon (graphite) blocks 12. Rods 18 are, for example, from 3 to 10 in number, they occupy a generally horizontal X-Y plane, and they extend generally in the X-direction. As will be appreciated, the individual rods 18 are generally equally spaced in the Y-direction, and they are mutually parallel.

Within the spirit and scope of this invention, rods 18 can be electrically connected in series or in parallel.

Carbon rods 18 are heated to a high temperature by means of an AC electric current that is supplied by the secondary coil 116 of an isolation and step-down AC transformer 16 whose primary coil 126 is connected to AC power control 14. Pyrometer 15 measures the surface temperature of heated carbon rods 18, and its output 118 is connected as a first input to power control 14. Pyrometer 15 and power control 14 respond to the temperature of rods 18, and operate to adjust the AC power that is applied to rods 18, thereby maintaining the surface temperature of rods 18 at a desired set point temperature value that is applied as a second input 117 to power control 14.

Important to this invention is the fact that hot rods 18 are of a sufficient cross sectional size that they do not droop, generally in the Z-direction, to any appreciable extent due to the high operating temperature of hot rods 18. In a preferred embodiment of the invention, hot rods 18 were of a generally circular cross section. However, the spirit and scope of this invention is not to be limited to this specific cross sectional shape.

A generally X-Y planar substrate 11 is mounted at a generally fixed Z position above and relatively close to heated carbon (graphite) rods 18. A gas, such as silane, flows from a plurality of uniformly distributed holes that are formed along the length of gas injector 19. This gas flows into the space that exists between substrate 11 and carbon (graphite) rods 18. The high temperature of carbon (graphite) hot rods 18 operates to break down the gas that flows over the hot rods into constituents that then operate to produce a semiconductor film on the nearby bottom surface of substrate 11, all of this occurring in the well known manner.

While not required, as a feature of this invention, the uniformly distributed holes that are formed along the X-dimension length of gas injector tube 19 span an X-distance that is generally equal to the corresponding X-dimension of substrate member 11. Also not required is the feature that gas injector tube 19 is a linear tube that is spaced above and a short distance to one side of hot rods 18 and that extends generally parallel to hot rods 18.

A X-Y planar and metal shutter 17 is movably positioned (by a drive mechanism not shown) so as to be selectively positioned intermediate substrate 11 and carbon (graphite) rods 18 only during the time period during which carbon (graphite) rods 18 are heating up to operating temperature 117. Shutter 17 thereby shields or isolates substrate 11 from rods 18 and the gas plasma during this heat-up time period, thus avoiding an undesirable initial semiconductor film deposition on the bottom surface of substrate 11. When the operating temperature 117 of rods 18 has been reached, shutter 17 is moved out of this position intermediate substrate 11 and rods 18.

As a feature of the invention, RF power supply 13 supplies radio frequency power to carbon (graphite) rods 18.

Figure 2:
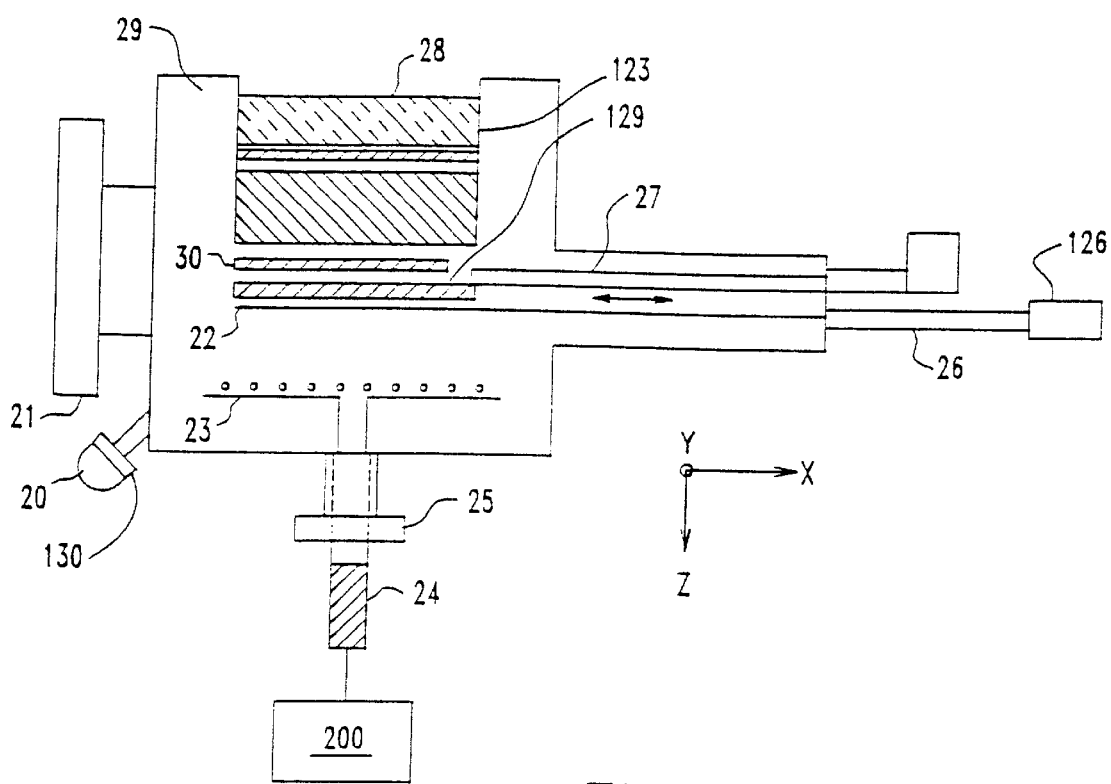
FIG. 2 is a showing of another embodiment of the invention, this figure also showing a vacuum chamber of the type that can be used with the FIG. 1 embodiment. For convenience, the FIG. 1 gas injector and shutter are not shown in FIG. 2, however, they are both present between the substrate and the hot rod assembly, as is shown in FIG. 1.

FIG. 2 shows another embodiment of the invention. This figure also shows a vacuum chamber 29 of the type that can be used with the FIG. 1 embodiment. For convenience, a gas injector tube such as above described tube 19 is not shown in FIG. 2, however, one is present between FIG. 2 substrate member 30 and hot carbon rod assembly 23. Again, substrate member 30 and hot carbon rod assembly 23 are generally parallel and X-Y planar members. However, in FIG. 2, linear carbon rods 23 extend generally in the Y-direction. Note that FIG. 2 again shows the use of a plurality of hot rods 23, and in this case, ten hot rods 23.

As was described with reference to FIG. 1, a controller (not shown in FIG. 2) is provided and connected to a pyrometer 20 for the purpose of controlling the surface temperature of hot rods 23 to a control point temperature setting. In FIG. 2, pyrometer 20 views hot rods 23 thorough a sapphire window 130.

Also, as described with reference to FIG. 1, a shutter (not shown in FIG. 2) is preferably provided between substrate member 30 and hot rod assembly 23.

Carbon (graphite) hot rod assembly 23 is mounted in vacuum chamber 29 for linear and vertical motion by way of a vacuum feed through 24 that is mounted onto a bottom wall flange 25 of vacuum chamber 29. A linear drive mechanism 200 operates by way of feed through 24 to control the vertical position of carbon (graphite) hot rods 23, and thereby the vertical spacing of hot rods 23 and substrate member 30.

Substrate 30 is mounted or inserted into vacuum chamber 29, and onto a substrate carrier 129, by way of a loading entry/gate valve 21. In this embodiment of the invention, substrate carrier 129 occupies a fixed position horizontal or X-Y plane.

In accordance with a feature of this invention, an oscillation drive mechanism 27 is connected to substrate carrier 129 to provide linear and oscillatory motion in the X-direction, generally normal to the Y-direction in which hot rods 23 extend. This oscillatory motion 27 operates to achieve uniform film deposition on the bottom surface of substrate 30. As a feature of this invention, the magnitude of this X-direction oscillatory motion 27 of substrate member 30 and its substrate carrier 129 is generally equal to the uniform X-direction spacing of the hot rods 23.

A X-Y planar shutter 22 is mounted be driven in the X-direction by a linear motion feed through 26 and drive mechanism 126, to thereby shield substrate member 30, as above described, from any initial film deposition before the temperature of hot rods 23 reaches the pre-set temperature set point value.

An insulated heater assembly 28 is located within a U-shaped cavity 123 that is formed in the top portion of vacuum chamber 29. Heater assembly 28 operates to heat and maintain substrate member 30 at a desired elevated temperature.

Figure 3:
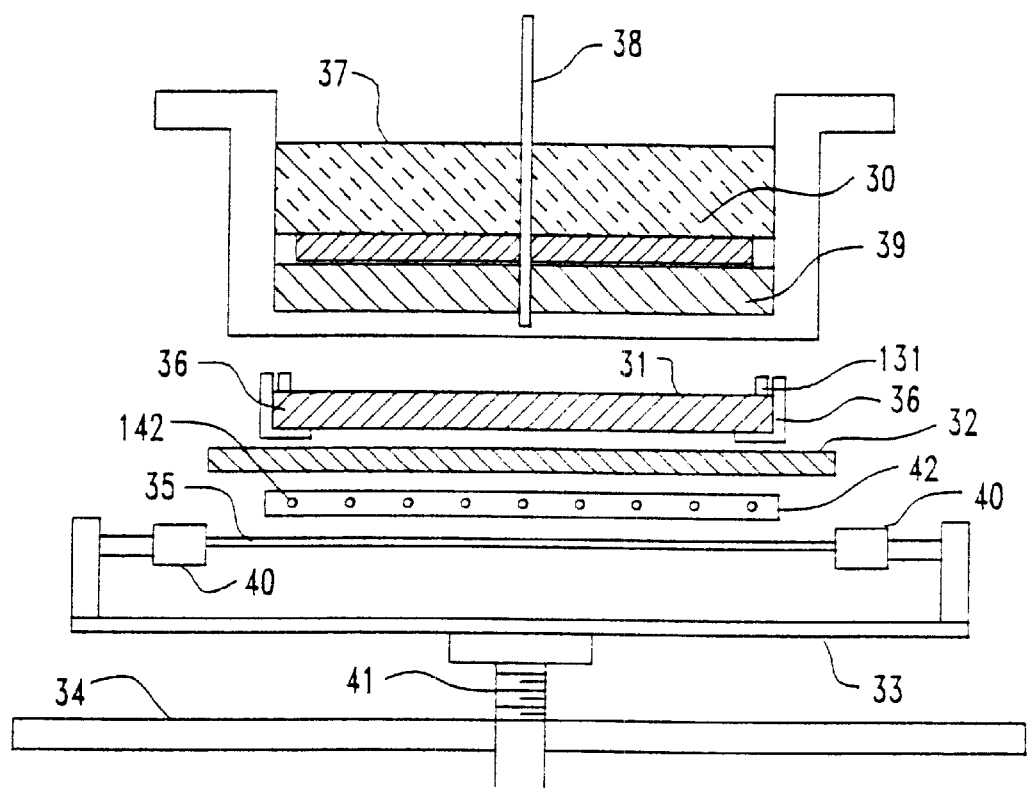
FIG. 3 is an extension of the FIG. 2 embodiment.
Figure 3:
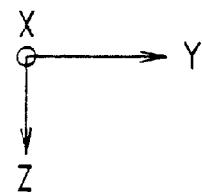

FIG. 3 is an extension of the FIG. 2 embodiment. FIG. 3 shows additional details of the hot rod CVD apparatus of the present invention, along with supporting components that are attached to a surrounding vacuum chamber for which only the bottom wall 34 and top U-shaped cavity 37 are shown.

The carbon (graphite) rod assembly, which consists of a plurality of linear and parallel carbon (graphite) rods 35 and two linear and parallel connection blocks 40, is mounted onto a support platform 33, which is vertically adjustable for linear motion in the Z direction by way of a vacuum feed through 41, which is mounted on and extends through the bottom wall 34 of the vacuum chamber. Again, hot rods 35 are mutually parallel and occupy an X-Y plane.

Substrate 31 sits in, and is carried by, an X-Y planar substrate carrier 131 that is, and substrate carrier 131 slides on, and is supported by, a pair of linear and parallel tracks 36 that extend in the X-direction.

A fixed position and generally linear gas injector tube 42 extends in the Y-direction and operates to inject gas into the gas space between substrate 31 and carbon (graphite) rods 35, through a plurality of evenly distributed holes 142 that are located along the Y-direction length of gas injector tube 42.

A metal and X-Y planar shutter 32 selectively slides between substrate 31 and carbon (graphite) rods 35 when carbon (graphite) rods 35 are heating up to there operating temperature, thereby prevent an undesirable initial deposition of low quality film on the bottom surface of substrate 31. Again, shutter 32 is moved out of the way after carbon (graphite) rods 35 reach the desired set point surface temperature.

The temperature of substrate 31 is maintained at a desired set point temperature by operation of a heater 39 that is mounted in a U-shaped heater well 37 that is formed into the top wall of the vacuum chamber. A thermal insulation block 30 prevents heat loss from heater well 37. A thermocouple 38 is mounted onto the bottom wall of heater well 37, and the temperature measurement effected by thermocouple 38 is used to control power to heater 39 in order to maintaining the bottom wall of heater well 37 at the desired set point temperature.

Figure 4:
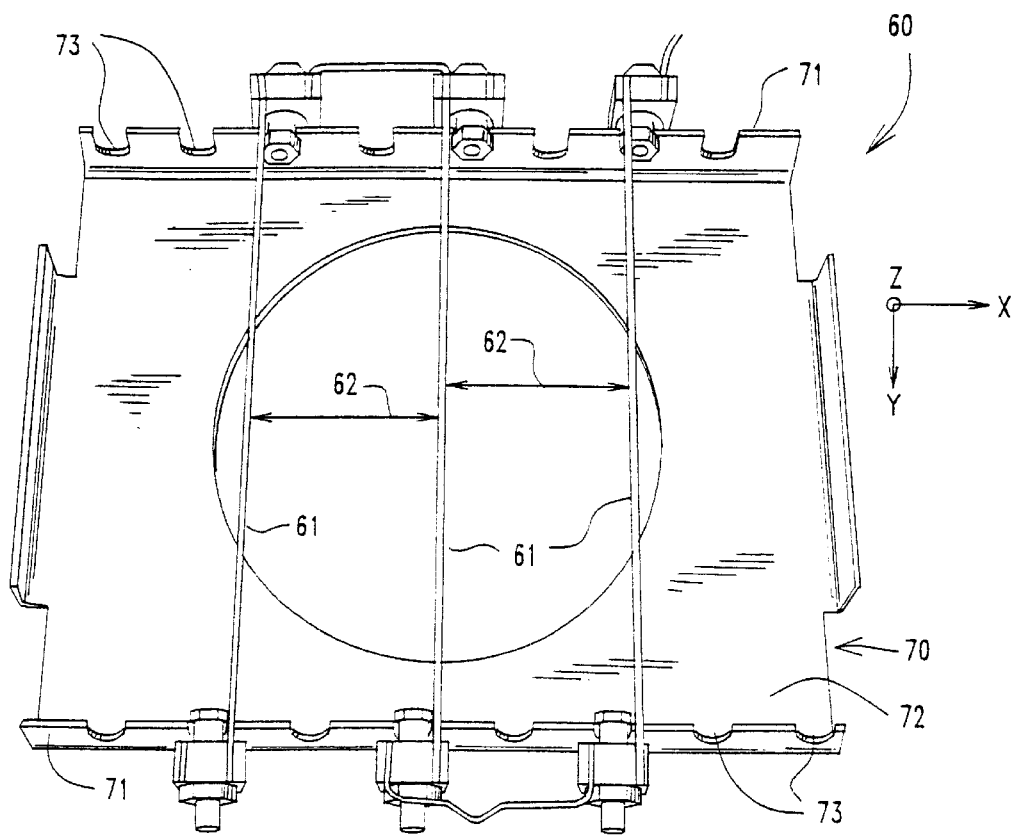
FIG. 4 is a top view of a hot rod assembly that is useful in FIGS. 1–3, this figure showing how the individual rods are mutually parallel and coplanar, and this figure also showing how the number of hot rods and the horizontal distance between the hot rods can be changed as desired.
Figure 5:
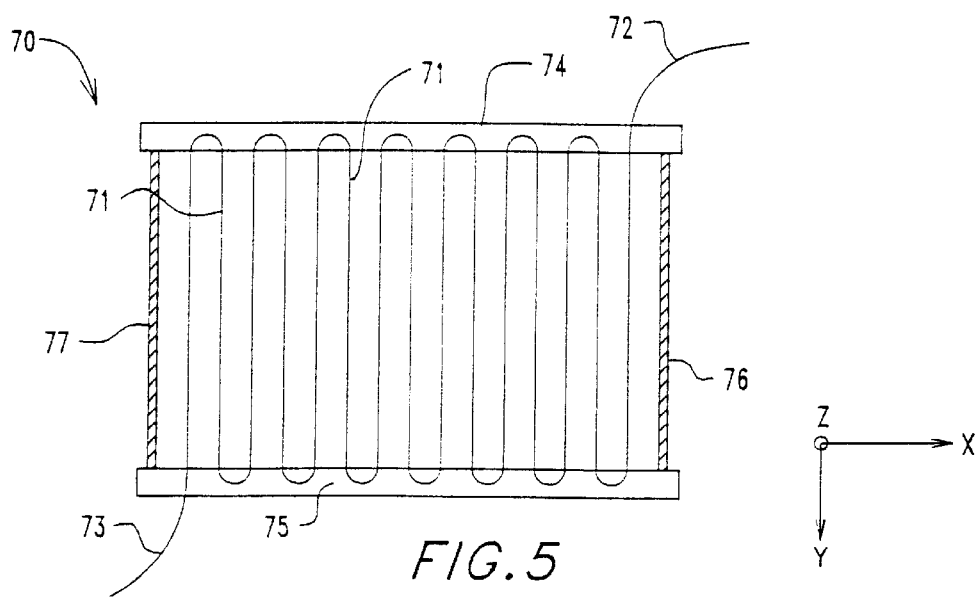
FIG. 5 is a top view of another hot rod assembly that is useful in FIGS. 1–3, this hot rod assembly having fifteen mutually parallel and coplanar hot rods that are electrically connected in series.

FIG. 4 is a top view of a hot rod assembly 60 of the type that is used in the FIGS. 1–3 embodiments of this invention. FIG. 5 shows how the individual hot rods 61 are supported mutually parallel and coplanar, and FIG. 5 also shows how the horizontal distance 62 between hot rods 61 can be adjusted.

Hot rod assembly 60 includes a metal frame 70 having two upstanding side flanges 71 that are mutually parallel and that extend at a 90-degree angle away from the flat major portion 72 of frame member 70, in a direction toward the associated substrate member. In this way, the full length of each hot rod 61 (which may be connected electrically in series or in parallel) is exposed to the gas flow and to the adjacent surface of the substrate member on which the semiconductor film is deposited by way of the hot rod CVD process of this invention.

Three carbon hot rods 61 in accordance with this invention are shown as mounted within three mating slots 73 that are formed in side flanges 71. This mounting means operates in a well-known manner to electrically insulate hot rods 61 from metal frame 70. Note that each of the two side flanges 71 include eight such pairs of mating slots 73. Thus, the hot rod assemble shown in FIG. 3 could accommodate up to eight coplanar, equally spaced, and mutually parallel hot rods 61. That is, when the number N of mating slots 73 are provided in accordance with this invention, up to the number N of individual coplanar, equally spaced, and mutually parallel hot rods can be provided, as is desired for any particular hot rod CVD process.

FIG. 5 is a top view of another hot rod assembly 70 that is useful in FIGS. 1–3, wherein hot rod assembly 70 includes fifteen mutually parallel and coplanar hot rods 71 that are electrically connected in series, to thereby provide connections 72,73 for connection to an electrical power source. In this embodiment, a rigid rectangular frame is formed by the two parallel members 74 and 75 and the two parallel members 76 and 77.

A typical X-Y planar size of a hot rod assembly as shown in FIGS. 4 and 5 is about 7-inches wide, that is the Y-dimension that the hot rods span, and about 7-inches long, this example size being for deposition on a relatively thin planar substrate member that is about 6-inches square. For a substrate planar size of about 30×40 cm, the corresponding size of the hot rod assembly would be about 40×50 cm.

While hot rods in accordance with preferred embodiments of this invention are self supporting as the hot rods span the distance between the two opposite sides of an associated frame, and the opposite ends are then clamped in position at the two opposite side of the associated frame, it may desirable to place the hot rods in tension, and then clamp there ends to the two opposite sides of the associated frame.

Without limitation thereto, graphite hot rods in accordance with embodiments of this invention were of a circular cross section, having a diameter in the range of from about 0.5 to about 3.0 mm, and the center to center spacing of the hot rods was in the range of from about 0.5 to about 5.0 cm.

Typical substrate to hot rod spacing was in the range of from about 1.0 to about 20.0 cm. Typical gas flow rates were in the range of from about 1.0 to about 1000 cc per minute, at parallel flow or cross flow. A typical size of an associated vacuum chamber was about 20 liters.

In embodiments of this invention, typical deposition parameters for amorphous silicon (intrinsic, n-type and p-type) and for intrinsic micro-crystalline silicon were as follows;

| FILM TYPE | GASES USED | SUBSTRATE TEMP. | DEPOSITION PRESSURE | ROD TEMP |
|---|---|---|---|---|
| a-Si (i) | $SiH_4$ | 220 deg. C | 30 mTorr | 1600 deg. C |
| a-Si (n) | $SiH_4, PH_3$ | 220 deg. C | 30 mTorr | 1600 deg. C |
| a-Si (p) | $SiH_4, B_2H_6$ | 80 deg. C | 30 mTorr | 1600 deg. C |
| microxtal Si | $SiH_4, H_2$ | 220 deg. C | 30 mTorr | 1800 deg. C |

Important to this invention, an electrically conductive and non-metallic material having an extremely high melting temperature, such as graphite or silicon carbide, but not limited thereto, is used to form the above-described hot rod assembly or grid. Material such as graphite has a melting temperature that is much higher than a metal such as tungsten. Therefore, a wider range of temperatures can be used during the deposition process that is provided by apparatus in accordance with this invention. In accordance with the invention, materials other than graphite can also be employed; for example, high temperature electrically conducting ceramics.

Because the resistivity of carbon/graphite is much higher than the resistivity of metal, heating elements in accordance with this invention can be constructed in the form of relatively thick rods, rather than using prior thin metal filaments. As a result, graphite rods in accordance with this invention are more durable than prior thin metal filament heating elements. In addition, graphite is chemically more inert than metal. Hence, graphite rods in accordance with this invention do not react with silicon or hydrogen radicals as easily as do thin metal filaments. This property further enhances the durability of the present application's graphite rods for HWCVD applications. Because a material, such as graphite, is chemically more stable, and has an extremely high melting temperature, graphite rods are less likely to contaminate high quality semiconductors, for example silicon semiconductors.

While embodiments of this invention have been described relate to using a silane gas (silicon tetrahydride or $SiH_4$), the spirit and scope of the invention is not to be limited to using this specific gas. For example, a usable gas combination could include, $SiF_4$ and $H_2$ and/or silane, or other gas combinations as are apparent to those of skill in this art. Usable gases include, but are not limited to, dichlorosilane, germane (germanium hydride or $Ge_nH_{2n+2}$) and methane (methyl hydride or $CH_4$), to fabricate semiconductors such as Si:Ge, SiC, SiN, GeN. This list of gasses is meant only as a guide, and the invention is not to be limited to these gas precursors, but could include fluorine precursors to reduce density of defect states in the resulting material.

Further, with the use of dopant gasses, such as $PH_3$ and $B_2H_6$ or the like, semiconductor doping of n-type and p-type can be accomplished with silicon as the host matrix. This invention can also be used with liquid sources to produce materials such as GaAs, GaN, SiC and the like. Other suitable n-type and p-type dopants could be used in the fabrication of materials, such as GaAs.

To further improve the electronic quality of the resultant poly-crystalline silicon films and such characteristics as grain size, the substrate's semiconductor film can be heat treated via a suitable temperature profile treatment. This can be accomplished with suitable heating and cooling techniques, such as, but not limited to, intense light illumination, passing the semiconductor film through a preheated high temperature zone, etc. Heat treatment can also be simultaneously accomplished during the above described hot rod CVD deposition process.

With an appropriate arrangement of deposition equipment and processing procedures, the invention can be repeated multiple times to form multiple layers on the substrate member. For example, to manufacture p-type/i-type/n-type materials useful in forming optoelectrical devices and large area modules, such as solar cells, optical sensors, and thin film transistors.

As a feature of this invention, material growth on the substrate member is enhanced by superimposing an external electric field, such as an RF (radio frequency) field, or a DC field, on the hot rods of the invention, or by the application of a bias electric field to the substrate member, or to a metal mesh that may be located between the substrate member and the hot rods.

The substrate to rod distance (for example, see 120 of FIG. 1) is a critical parameter that dictates film properties and the film deposition rate on the substrate member. An example range of the substrate to rod distance is in the range of from about 1 to about 5 centimeters.

The above described relative oscillation that is provided in accordance with the invention between the substrate member and the graphite hot rod assembly provides an improvement in film thickness uniformity over the entire deposition area on the substrate member.

The gas injector design of this invention operates to convert a single tube gas inlet into a multi-point distribution of gas across the substrate member in the following unique manner. In accordance with the invention, the above-described gas injector comprises a linear tube whose length is generally equal to a corresponding dimension of the substrate member. Small diameter holes are evenly distributed along this length of the gas injector tube so as to span this corresponding length of the substrate member. Opposite ends of the linear gas injector tube are closed, and a gas supply pipe is connected to generally the middle of the gas injector tube. As a result, gas is injected evenly into the gas plasma space that exists between the substrate member and the hot rods, this injection taking place via the small diameter holes that are evenly distributed along the length of the gas injector tube.

During start up of the invention, the temperature of the graphite rods is below the desired set-point temperature, and hence any initial film deposited on the substrate member would usually be of a poor quality. It should be noted that this initial film deposit is important, especially for electronic device fabrication. The function of the above described shutter is to physically shield or isolate the substrate member from undesirable semiconductor deposition during the period of time during which the graphite hot rods are heating up to an operating temperature that is determined by a set-point temperature input. For example, the operating surface temperature of graphite the hot rods is generally in the range of about 1400 to about 1800-degrees centigrade.

In the above-described way, the present invention converts the HWCVD technology into a practical production process by greatly extending the lifetime of apparatus, and by improving the reproducibility of the finished substrate member, these being but two important contributions of the present invention.

Since it is known that others skilled in the art will readily visualize yet other embodiments of the invention that are within the spirit and scope of this invention, the above detailed description of embodiments of the invention are not to be taken as a limitation on the spirit and scope of this invention.

What is claimed is:

1. Hot wire chemical vapor deposition apparatus, comprising:
    a generally planar substrate member having a surface upon which a layer is to be deposited from a gas plasma;
    a generally planar heating member distance spaced from said substrate member, said heating member being generally parallel to said substrate member;
    a plurality of non-metallic, electrically conductive, linear, mutually parallel, uniformly spaced by a given distance, high melting temperature, and coplanar hot rods having opposite ends mounted to said heating member; said hot rods being generally parallel to said substrate member;
    a voltage source connected to said opposite ends of said hot rods and operative to resistively heat said hot rods; and
    gas injector means for injecting a deposition gas intermediate said substrate member and said heating member.

2. The apparatus of claim 1 including:
    drive means connected to said heating member for selectively varying said distance spacing.

3. The apparatus of claim 1 including:
    control means connected to said voltage source;
    temperature sensing means responsive to a temperature of said hot rods and providing a first input to said control means; and
    set point temperature means providing a second input to said control means;
    said control means operating to energize said hot rods as a function of a comparison of said temperature of said hot rods to said set-point temperature.

4. The apparatus of claim 1 wherein said deposition gas is injected onto said hot rods, and including:
    drive means associated with at least one of said substrate member and said heating member to produce relative motion between said substrate member and said heating member while maintaining said substrate member and said heating member said distance spacing and while maintaining said heating member generally parallel to said substrate.

5. The apparatus of claim 4 wherein said relative motion is in a direction that is generally normal to a direction in which said hot rods extend.

6. The apparatus of claim 4 wherein said relative motion is an oscillator motion.

7. The apparatus of claim 6 wherein said oscillator motion has a magnitude that is generally equal to said given distance and that is generally normal to a direction in which said hot rods extend.

8. The apparatus of claim 1 wherein said hot rods are selected from the group carbon hot rods, graphite hot rods, electrically conductive silicon carbide hot rods, and electrically conductive ceramic hot rods.

9. The apparatus of claim 8 including:
    drive means connected to said heating member for selectively varying said distance spacing.

10. The apparatus of claim 8 wherein said deposition gas is injected onto said hot rods, and including:
    drive means associated with at least one of said substrate member and said heating member to produce relative motion between said substrate member and said heating member while maintaining said substrate member and said heating member said fixed distance relationship and said parallel relationship.

11. The apparatus of claim 10 wherein said relative motion is in a direction that is generally normal to a direction in which said hot rods extend.

12. The apparatus of claim 10 wherein said relative motion is an oscillator motion.

13. The apparatus of claim 12 wherein said oscillator motion has a magnitude that is generally equal to said given distance and that is generally normal to a direction in which said hot rods extend.

14. The apparatus of claim 13 including:
    drive means connected to said heating member for selectively varying said distance spacing.

15. The apparatus of claim 14 including:
    control means connected to said voltage source;
    temperature sensing means responsive to a temperature of said hot rods and providing a first input to said control means; and
    set-point temperature means providing a second input to said control means;
    said control means operating to energize said hot rods as a function of a comparison of said temperature of said hot rods to said set-point temperature.

16. Hot rod chemical vapor deposition apparatus, comprising:
    a vacuum deposition chamber;
    a generally planar substrate carrier within said deposition chamber for holding a substrate member having a width and having a surface upon which a layer is to be deposited from a gas plasma;
    a generally planar heating member within said deposition chamber;
    said heating element being spaced from said substrate carrier and said heating member being generally parallel to said substrate carrier;
    a plurality of non-metallic, electrically conductive, linear, mutually parallel, uniformly spaced, high melting temperature, and coplanar hot rods mounted to said heating member; and said hot rods being generally parallel to said substrate carrier;
    at least a portion of said length of said hot rods spanning said width of said substrate member;
    a voltage source external to said deposition chamber and electrically connected to said hot rods to resistively heat said hot rods;
    a linear gas injector tube within said deposition chamber;
    at least a portion of said length of gas injector tube spanning said width of said substrate member;
    a plurality of uniformly spaced gas flow openings formed along said length of said gas injector tube for injecting a deposition gas intermediate said substrate carrier and said heating element; and a pressurized source of deposition gas external of said deposition chamber and connected to said gas injector tube.

17. The apparatus of claim 16 including:

control means external to said deposition chamber and connected in controlling relation to said voltage source;

a viewing window in said deposition chamber;

temperature sensing means external to said deposition chamber and associated with said viewing window to sense a temperature of said hot rods and to provide a first input to said control means; and set-point temperature means external to said deposition chamber for providing a second input to said control means;

said control means operating to energize said hot rods as a function of a comparison of said temperature of said hot rods to said set-point temperature.

18. The apparatus of claim 17 including:

first drive means external to said deposition chamber and connected by way of a first vacuum connection to at least one of said substrate carrier and said heating member to produce relative oscillator motion between said substrate carrier and said heating member while maintaining said spacing between said substrate carrier and said heating member, and while maintaining said parallel relationship between said substrate carrier and said heating element.

19. The apparatus of claim 18 wherein said relative motion is in a direction that is generally normal to a direction in which said hot rods extend.

20. The apparatus of claim 19 wherein said oscillator motion has a distance magnitude that is generally equal to said uniformly spacing of hot rods.

21. The apparatus of claim 20 including:

second drive means external to said deposition chamber and connected by way of a second vacuum connection to at least one of said substrate carrier and said heating member;

said second drive means being selectively operable to vary said spacing between said substrate carrier and said heating member while maintaining said parallel relationship between said substrate carrier and said heating element.

22. The apparatus of claim 21 wherein said hot rods are selected from the group carbon hot rods, graphite hot rods, electrically conducting silicon carbide hot rods, and electrically conducting ceramic hot rods.

23. In a hot wire chemical vapor deposition apparatus wherein constituents of deposition-gas are deposited on a substrate, a gas decomposing element comprising:

a frame member having a first side wall and a second side that is generally parallel to said first side wall; and a plurality of linear hot rods having opposite ends connected to said first and second side walls such that said hot rods are mutually parallel, uniformly spaced, and coplanar;

said hot rods being selected from the group carbon hot rods, graphite hot rods, electrically conducting silicon carbide hot rods, and electrically conducting ceramic hot rods; and a voltage source connected to resistively heat said hot rods.

24. The gas decomposing heating element of claim 23 wherein said linear hot rods are linear graphite hot rods.

25. The gas decomposing heating element of claim 23 wherein said linear hot rods have a circular cross section in a diameter range of from about 0.2 to about 3.0 mm, and wherein said linear hot rods are center to center spaced in the range of from about 0.5 cm to about 5.0 cm.

* * * * *